United States Patent
Nakajima et al.

(10) Patent No.: US 7,312,482 B2
(45) Date of Patent: Dec. 25, 2007

(54) SEMICONDUCTOR DEVICE, POWER AMPLIFIER DEVICE AND PC CARD

(75) Inventors: Akishige Nakajima, Higashiyamato (JP); Hidenori Suenaga, Takasaki (JP); Eigo Tange, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/541,606

(22) Filed: Oct. 3, 2006

(65) Prior Publication Data

US 2007/0023897 A1 Feb. 1, 2007

Related U.S. Application Data

(62) Division of application No. 10/784,988, filed on Feb. 25, 2004, now abandoned.

(30) Foreign Application Priority Data

Feb. 25, 2003 (JP) ............................. 2003-046644

(51) Int. Cl.
*H01L 29/49* (2006.01)
(52) U.S. Cl. ...................... 257/159; 257/157; 257/158; 257/160
(58) Field of Classification Search ......... 157/157–160
See application file for complete search history.

(56) References Cited

U.S. PATENT DOCUMENTS 5,343,071 A 8/1994 Kazior et al.
5,546,049 A * 8/1996 Wen et al. .................. 330/277
5,955,763 A * 9/1999 Lin ............................ 257/355
2006/0076620 A1* 4/2006 Akamine et al. ........... 257/341

FOREIGN PATENT DOCUMENTS

JP 8-330568 12/1996
JP 11-220344 8/1999

* cited by examiner

*Primary Examiner*—Thao X. Le
*Assistant Examiner*—Abul Kalam
(74) *Attorney, Agent, or Firm*—Antonelli, Terry, Stout & Kraus, LLP.

(57) ABSTRACT

The present invention is directed to improve high frequency characteristics by reducing inductance of a source. In an HEMT assembled in a power amplifier device, each of a drain electrode, a source electrode, and a gate electrode is constructed by a base portion and a plurality of fingers projected in a comb-teeth shape from the base portion, and the fingers of the electrodes mesh with each other. In the source electrode, a width of the fingers positioned at both ends of the plurality of fingers is wider than a width of each of the fingers positioned between both ends. The width of each of the fingers positioned at both ends is a width equal to or larger than a sum of the widths of the plurality of fingers positioned between both ends, and the width of the base portion is wider than that of each of the fingers positioned at both ends. An electrode pad provided for the source base portion and an external electrode terminal are connected to each other via a conductive wire.

11 Claims, 13 Drawing Sheets

SEMICONDUCTOR DEVICE, POWER AMPLIFIER DEVICE AND PC CARD

CROSS REFERENCE TO RELATED APPLICATION

This application is a divisional application of application Ser. No. 10/784,988, filed Feb. 25, 2004, now abandoned the disclosure of which is hereby incorporated by reference.

BACKGROUND OF THE INVENTION

The present invention relates to a semiconductor device, a power amplifier device, and a personal computer (PC) card and, for example, to a technique effectively applied to manufacturing of a PC card for a wireless LAN.

As penetration of personal computers to offices and homes increases, communication between personal computers typified by the Internet is being actively performed. Attention is being paid to a wireless LAN (local area network) for performing the communication between personal computers wirelessly, not by wire. At present, a wireless LAN conformed to the 2.4-GHz band "IEEE (The Institute of Electrical and Electronics Engineers, Inc.) 802.11b" standard is in the mainstream. However, since the transmission speed is 8 Mbps at the maximum and is low, it causes a problem that a moving image cannot be transmitted. One of solutions to the problem is a wireless LAN of the 5 GHz band "IEEE802.11a" standard enabling the maximum transmission speed of 54 Mbps.

In a PC card for use in the wireless LAN, an antenna, a transmission/reception change-over switch, a low-noise amplifier for reception, a mixer for reception, a mixer for transmission, a power amplifier for transmission, and the like are assembled.

Semiconductor devices of high frequencies such as a few GHz (for example, an HEMT (High Electron Mobility Transistor), an MMIC (Monolithic Microwave IC), and the like) are formed on the basis of a compound semiconductor substrate such as a GaAs substrate.

On the other hand, in a field effect transistor (FET) to increase the performance of a device in a high frequency band, for example, in place of a configuration of connecting a source electrode on the top face of a semiconductor chip and a source terminal of a package substrate via a wire, a via hole penetrating a semiconductor chip is provided, a conductor is formed in the via hole, the source electrode on the top face of the semiconductor chip is led to the under face of the semiconductor chip and, when the semiconductor chip is fixed to the package substrate, the led source electrode is directly connected to the source terminal of the package substrate (seating), thereby achieving reduction in the source inductance (refer to, for example, Patent Reference 1).

As a power amplifier for transmission (power amplifier device for transmission) in a mobile communication system, there is a module or an integrated circuit (MMIC) using a GaAs-MESFET or a hetero junction bipolar transistor (HBT) (for example, Patent Reference 2).

[Patent Reference 1]

Japanese Unexamined Patent Publication No. Hei 8 (1996)-330568, pp. 2-3, FIG. 1

[Patent Reference 2]

Japanese Unexamined Patent Publication No. Hei 11(1999)-220344, pp. 2-5, FIGS. 1 and 8

SUMMARY OF THE INVENTION

A power amplifier for transmission assembled in a PC card for use in a wireless LAN is manufactured by use of a compound semiconductor (for example, GaAs) in order to realize a high frequency characteristic in an ultra high frequency band of 5 GHz. Generally, a power amplifier having a multi-stage amplification configuration in which transistors such as GaAs-MESFETs, HEMTs, HBTs, and the like formed on a GaAs substrate are cascaded in a number of stages is manufactured.

To realize smaller size and lighter weight, the mounting area of such a power amplifier is reduced. From the viewpoint of reduction in the number of parts to realize cost reduction as the customer needs, it is indispensable to form the power amplifier as an MMIC.

Techniques effective to realize formation of an MMIC includes (1) a via hole technique enabling higher performance by reducing a source inductance in an FET, (2) a high-density high-capacity technique realizing reduction in the capacity area by increasing capacity and density in the case of using an MIM (Metal-Insulator-Metal) capacitor as a capacitor in a matching circuit (input, inter-stage, and output matching circuit), and (3) a circuit optimizing technique for chip size reduction.

To form a via hole (having a diameter of, generally, about 50 μm), a new mask has to be added and the cost increases. For formation of a via hole, a thinner substrate (up to about 70 μm) and a high-precision back face processing technique are required. Consequently, there are problems such as increase in the number of processes and difficult handling.

As a measure to avoid the problems, a conventional configuration of the power amplifier using no via holes may be considered.

FIG. 16 is a plan view showing a comb-shaped electrode structure having a comb-teeth shaped electrode in a conventional FET. Each of a source electrode, a drain electrode, and a gate electrode has a comb-teeth shaped electrode pattern constructed by a base portion and a plurality of fingers extending from the base portion. Fingers 51$b$, 52$b$, and 53$b$ of a source (S) electrode 51, a drain (D) electrode 52, and a gate (G) electrode 53 are disposed so as to mesh with each other on a channel region 50. Specifically, the gate finger 53$b$ is positioned between the source finger 51$b$ and the drain finger 52$b$. Width W1 of the source finger 51$b$ and width W4 of the drain finger 52$b$ are the same. To reduce the source inductance, it is necessary to enlarge the area (L×W2) of the base portion (source base portion) 51$a$ of the source electrode 51 and increase the number of conductive wires connected to the base portion 51$a$.

FIG. 17 is a schematic plan view showing an example of a semiconductor chip constructing an amplifier by use of the FET of FIG. 16, that is, an MMIC chip. This MMIC chip (semiconductor chip) 60 has a configuration including an amplifier in one stage. Depending on the amplification factor, FETs are cascaded in a number of stages.

In FIG. 17, two FETs 61 and 62 each having the conventional FET structure shown in FIG. 16 operate in parallel, thereby increasing an output. The FET 61 has a source electrode 51', a drain electrode 52', and a gate electrode 53'. Source fingers 51$b$', drain fingers 52$b$', and gate fingers 53$b$' are disposed so as to mesh with each other on a channel region 50'. Specifically, a mesh pattern is formed such that the gate finger 53$b$' is positioned between the source finger 51$b$' and the drain finger 52$b$'. A source base portion 51$a$' is provided with a plurality of (six) square-shaped electrode pads 51c'. To the electrode pads 51c', conductive wires connected to the source terminals of a now-shown package are connected.

The FET 62 has a source electrode 51", a drain electrode 52", and a gate electrode 53". Source fingers 51b", drain fingers 52b", and gate fingers 53b" are disposed so as to mesh with each other on a channel region 50" in a manner similar to the FET 61. The source finger 51b" is provided with a plurality of (six) square-shaped electrode pads 51c". To the electrode pads 51c", conductive wires connected to the source terminals of a now-shown package are connected.

On the top face of the MMIC chip 60, as electrode pads, an electrode pad 65 for input, an electrode pad 66 for output, an electrode pad 67 for first power source voltage, an electrode pad 68 for second power source voltage, and an electrode pad 69 for third power source voltage are provided.

The gate electrodes 53' and 53" of the FETs 61 and 62 are connected to each other via strip lines 70' and 70" for a matching circuit. Between a connection node 71 and the electrode pad 65 for input, an MIM capacitor 72 is electrically connected. Between the connection node 71 and the electrode pad 69 for third power source voltage, a spiral inductance 73 is electrically connected.

The drain electrodes 52' and 52" of the FETs 61 and 62 are connected to a wire 80. Between the wire 80 and the electrode pad 66 for output, an MIM capacitor 81 is electrically connected. The wire 80 and the electrode pad 67 for first power source voltage are electrically connected to each other via a strip line 82 for a matching circuit. Between the MIM capacitor 81 and the electrode pad 68 for second power source voltage, a spiral inductance 83 is electrically connected.

In the structure, to make the inductance of the source electrode close to the inductance in the case of the via hole, the number of wires connected (metal lines each having a diameter of 25 μm) is set to the maximum number of six.

In such a structure, however, reduction in the source inductance is small. In the case of reducing the source inductance by increasing the number of wires, the chip size has to be increased by increasing the number of electrode pads (bonding pads). That is, the number of wires is specified by the size of the semiconductor chip.

The inventor herein has therefore analyzed and examined reduction in inductance in accordance with an electrode pattern in a state where the number of wires is set to the maximum and, as a result, achieved the present invention.

An object of the invention is to provide a semiconductor device with reduced inductance of an earth electrode.

Another object of the invention is to improve high frequency characteristics of a power amplifier device.

Further another object of the invention is to reduce the manufacturing cost of a power amplifier device.

Further another object of the invention is to provide a personal computer card having excellent high frequency characteristics.

The above and other objects and novel features of the invention will become apparent from the description of the specification and the attached drawings.

An outline of a representative one of inventions disclosed in the specification will be briefly described as follows.

(1) A personal computer card having a power amplifier device for transmission connected to an antenna, wherein the power amplifier device for transmission has one or a plurality of amplification systems, the amplification system has a semiconductor chip in which a transistor (FET) is formed and a plurality of external electrode terminals, the external electrode terminals are an input terminal to which a signal to be amplified is supplied, an output terminal for outputting the amplified signal, and first, second, and third power source terminals, two transistor are electrically connected in parallel between the input terminal and the output terminal, electrodes of the transistor are a control electrode (gate electrode) connected to the input terminal and the third power source terminal, a first electrode (drain electrode) connected to the output terminal and the first power source terminal, and a second electrode (source electrode) connected to the second power source terminal serving as an earth terminal, on the top face of the semiconductor chip, an electrode pad corresponding to the external electrode terminal and a plurality of electrode pads formed in the portion of the second electrode of the transistor are provided, a conductive wire for electrically connecting the external electrode terminal and the electrode pad corresponding to the external electrode terminal, and a conductive wire for electrically connecting the plurality of electrode pads formed in the portion of the second electrode of the transistor and the second power source terminal are provided, each of the electrodes of the transistor is constructed by a base portion and a plurality of fingers projected in a direction orthogonal to the base portion, one of the fingers of the first electrode (drain electrode) is disposed between two neighboring fingers of the second electrode (source electrode), the second electrode is connected to a fixed potential, and the width of each of the fingers positioned at both ends of the second electrode (source electrode) is wider than the width of each of the fingers positioned between the both ends. The width of each of the fingers positioned at both ends in the source electrode is equal to or wider than a sum of widths of the plurality of fingers positioned between the both ends, and the width of the base portion of the second electrode is wider than the width of each of the fingers positioned at both ends.

The power amplifier device also includes: a supporting substrate on which the semiconductor chip is mounted and constructing the second power source terminal; a plurality of leads disposed around the supporting substrate and constructing the external electrode terminals; and a sealing part made of an insulating resin for covering the supporting substrate, the external electrode terminal, the semiconductor chip, and the wire in a state where an under face and an external end face of each of the supporting substrate and the external electrode terminal are exposed.

DETAILED DESCRIPTION OF THE PREFERRED

Figure 1:
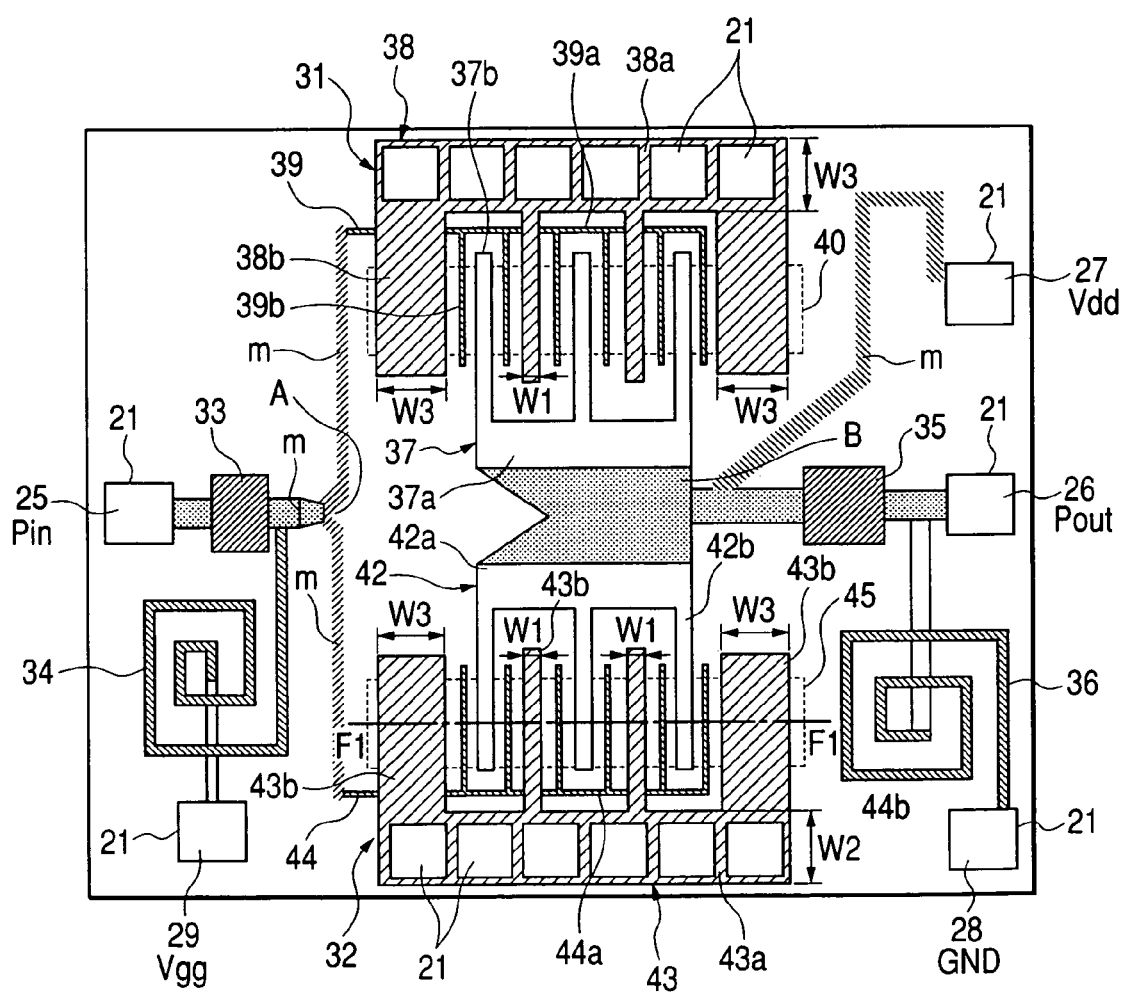
FIG. 1 is a schematic plan view of an MMIC chip to be assembled in a power amplifier device as an embodiment (first embodiment) of the invention.

Embodiments of the invention will be described in detail hereinbelow with reference to the drawings. In all of the drawings for explaining the embodiments of the invention, the same reference numeral is given to components having the same function and repetitive description will not be given.

FIRST EMBODIMENT

Figure 11:
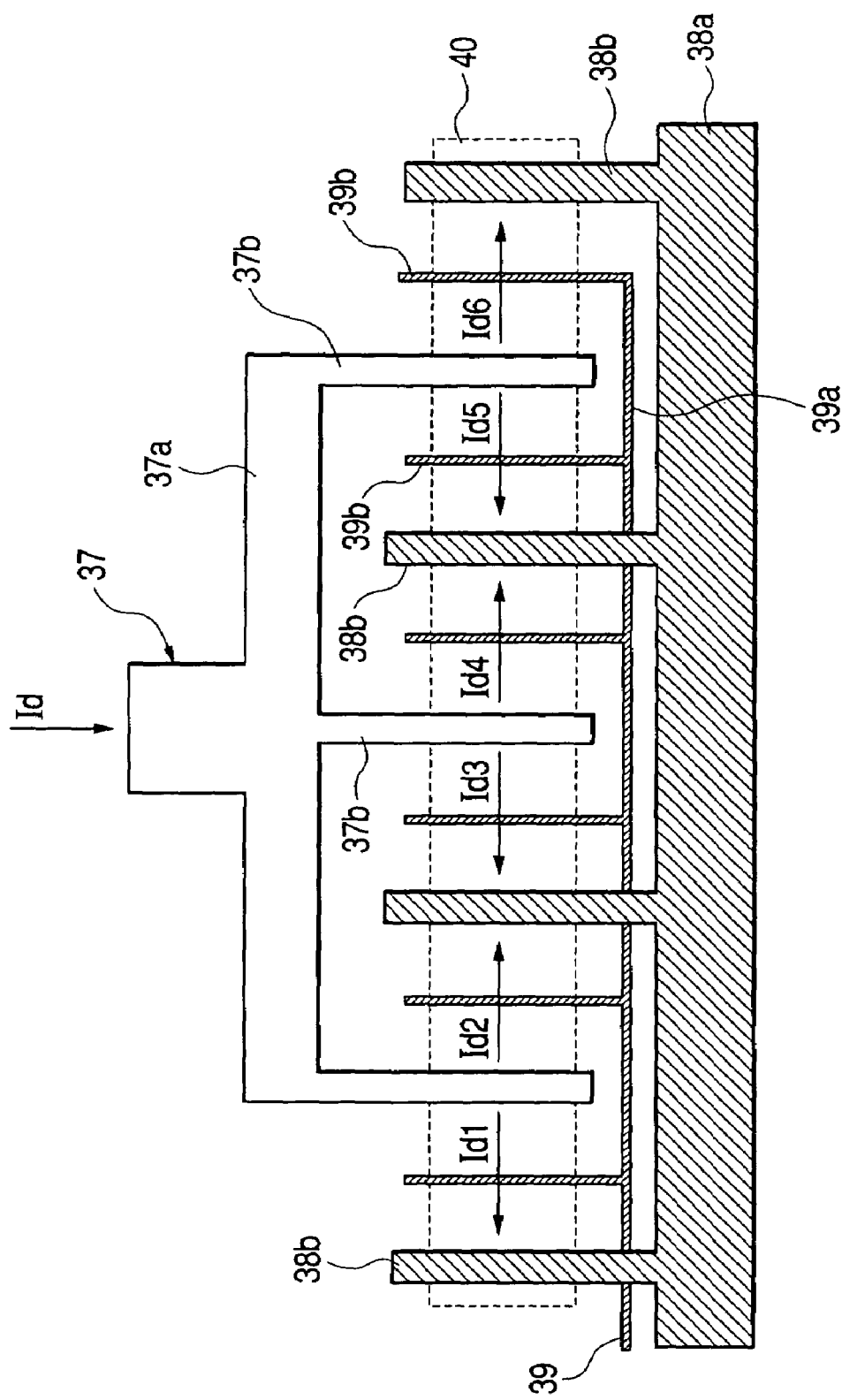
FIG. 11 is a schematic diagram showing a drain current path in the HEMT.
Figure 12:
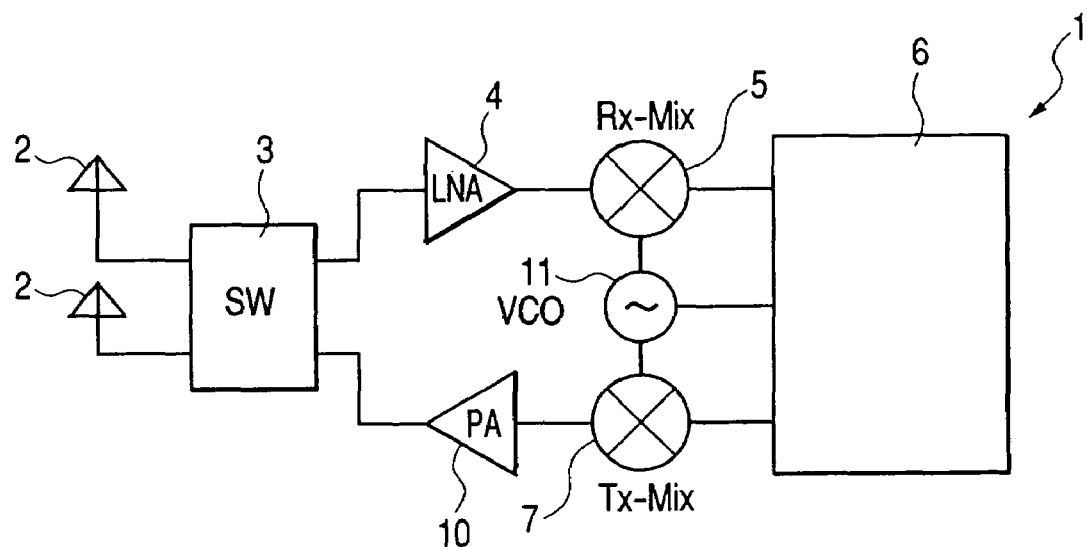
FIG. 12 is a block diagram showing a functional configuration of a wireless LAN PC card in which the power amplifier device of the first embodiment is assembled.
Figure 13:
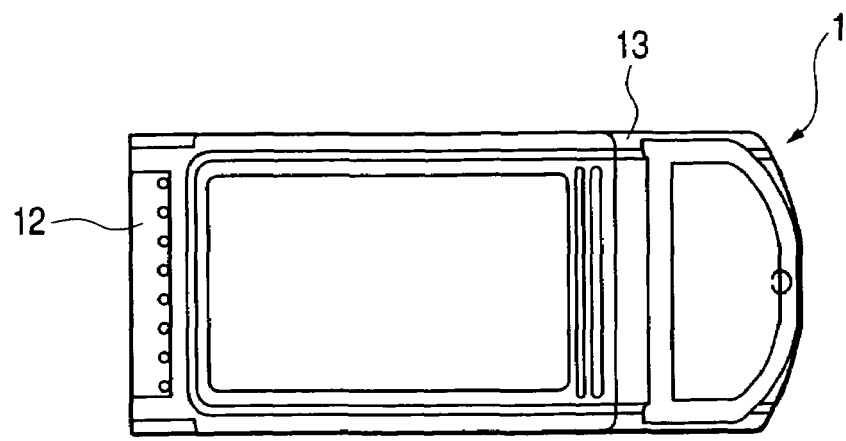
FIG. 13 is a schematic plan view showing the appearance of the wireless LAN PC card.

FIGS. 1 to 13 are diagrams related to a semiconductor device, a power amplifier device, and a personal computer card of a first embodiment. FIG. 1 is a diagram related to a semiconductor device (MMIC chip). FIGS. 2 to 11 are diagrams related to a power amplifier device. FIGS. 12 and 13 are diagrams related to a personal computer card.

A high frequency part of a personal computer (PC) card 1 for use in a wireless LAN has a reception system and a transmission system as shown in the block diagram of FIG. 12. The reception system includes an antenna 2, a transmission/reception change-over switch (SW) 3 to which the antenna 2 is connected, a low-noise amplifier (LNA) 4 for reception connected to the transmission/reception change-over switch 3, a mixer (Rx-Mix) 5 for reception connected to the low-noise amplifier 4 for reception, and a base band LSI 6 connected to the mixer 5 for reception. The transmission system includes the base band LSI 6, a mixer (Tx-Mix) 7 for transmission connected to the base band LSI 6, a power amplifier device 10 for transmission connected to the mixer 7 for transmission, the transmission/reception change-over switch 3 connected to the power amplifier device 10, and the antenna 2. A voltage controlled oscillator 11 is connected to the base band LSI 6, mixer 5 for reception, and mixer 7 for transmission. Although not described in detail, two antennas are provided to improve sensitivity in a diversity configuration.

The personal computer card 1 has a thin flat card structure as shown in FIG. 13. At one end of the personal computer card 1, a connector 12 is provided. When the personal computer card 1 is inserted into a card slot of a personal computer, the connector 12 is electrically connected to the personal computer. The antenna is built in a casing 13 of the personal computer card 1. The personal computer card 1 is a personal computer card for a wireless LAN conformed to the "IEEE802.11a" of the 5-GHz band enabling the maximum transfer speed of 54 Mbps.

For use in the ultra high frequency band of 5 GHz, each of the parts assembled in the personal computer card is requested to have high-level high frequency characteristics. Among the parts, the power amplifier device (high output power amplifier or high frequency power amplifier) is an important component. A high gain, a high output, and a low distortion characteristic are required, and low cost is also demanded.

Figure 2:
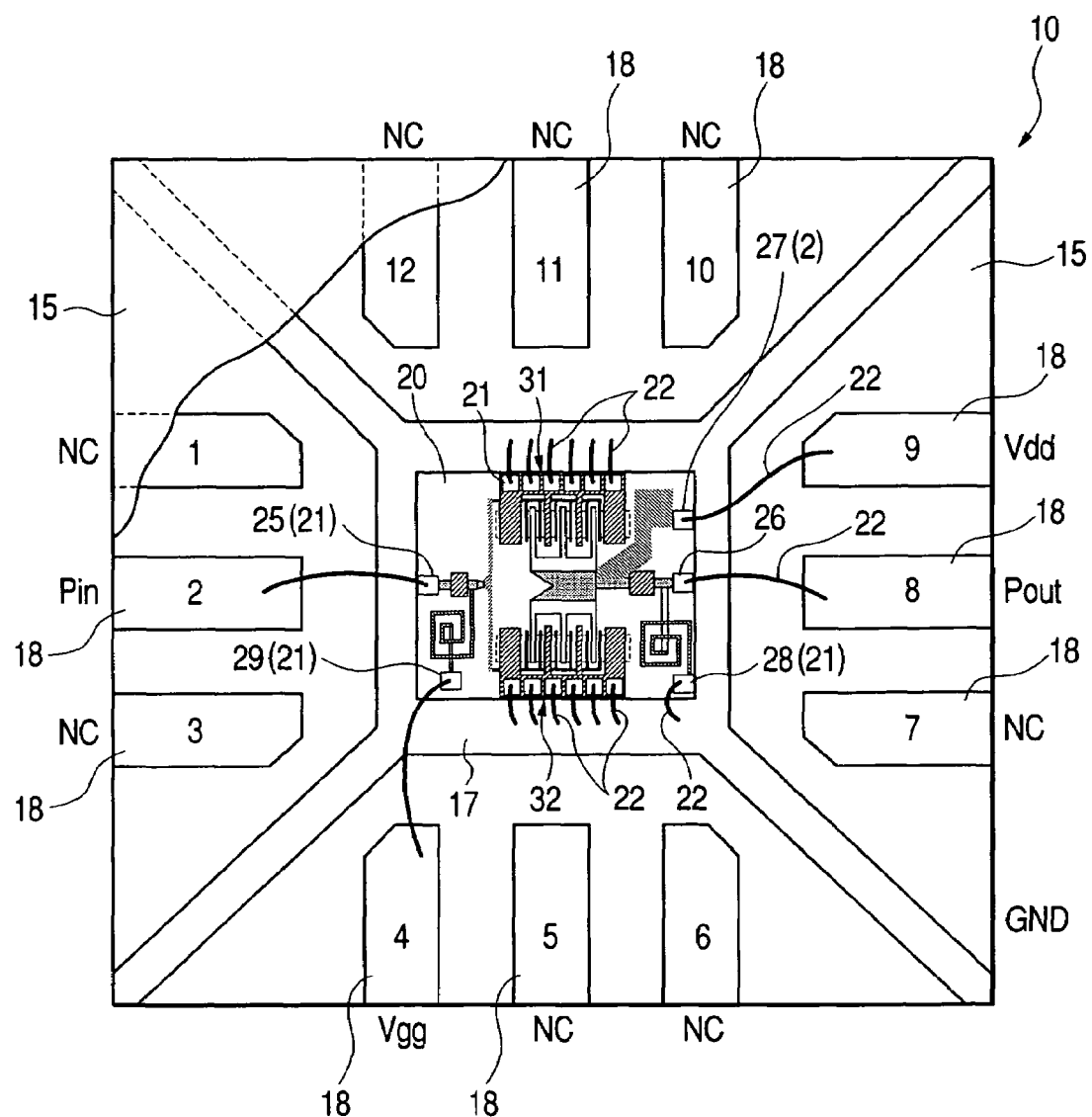
FIG. 2 is a partly-cutaway schematic plan view of the power amplifier device.
Figure 3:
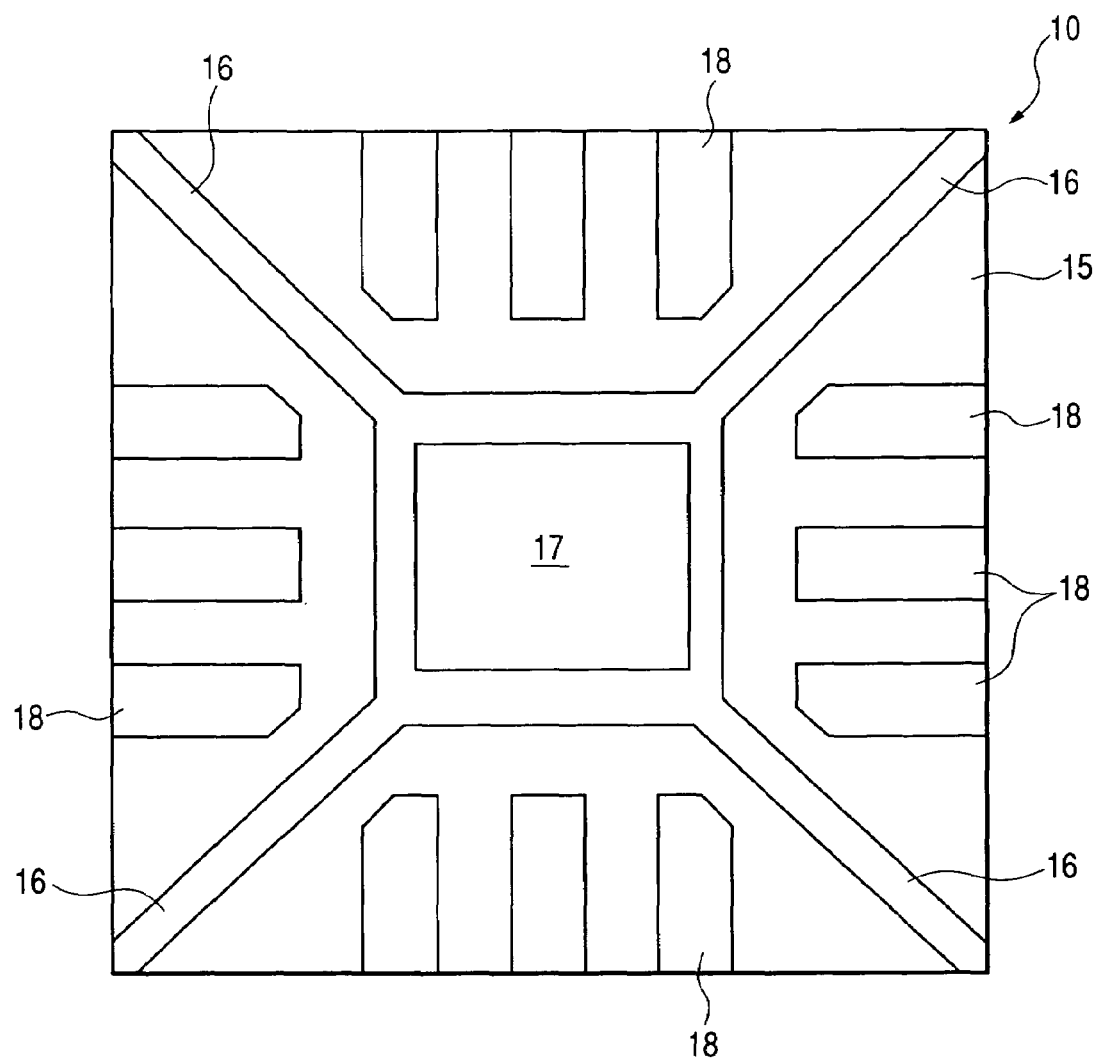
FIG. 3 is a bottom view of the power amplifier device.
Figure 4:
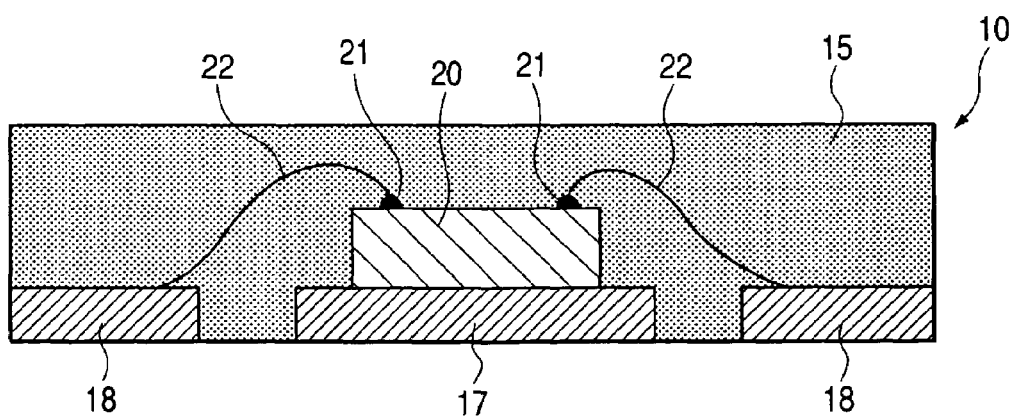
FIG. 4 is a cross section of the power amplifier device.

The power amplifier device 10 for transmission will now be described. FIGS. 2 to 4 are diagrams related to the power amplifier device 10. FIG. 2 is a partly-cutaway schematic plan view of the power amplifier. FIG. 3 is a bottom view, and FIG. 4 is a cross section.

As shown in FIGS. 2 to 4, the power amplifier device 10 has a thin flat square shape, and the top and side faces are formed by sealing parts 15 made of an insulating resin. In the under face (mounting face) of the sealing part 15, the under face of a square-shaped supporting substrate (TAB tape) 17 supported by thin TAB-tape supporting leads 16 is exposed. As shown in FIGS. 2 and 3, the TAB-tape supporting leads 16 extend along diagonal lines of the square on the under face of the sealing part 15. On the outside of each of the sides of the TAB tape 17, a plurality of leads 18 are disposed. Between the neighboring TAB-tape supporting leads 16, although not particularly limited, three leads 18 are disposed parallel to each other.

As shown in FIGS. 2 and 4, a semiconductor chip 20 is fixed to the top face of the TAB tape 17 by an unshown adhesive. As shown in FIG. 2, electrode pads 21 provided on the top face of the semiconductor chip 20 and the predetermined leads 18 are electrically connected to each other via conductive wires 22. As the wire 22, for example, a metal line having a diameter of 25 μm is used.

As shown in FIGS. 3 and 4, the sealing part 15 made of an insulating resin is formed on the top face side of the TAB tape 17 and the lead 18. The sealing part 15 completely covers the semiconductor chip 20 and the wires 22. The top face of the sealing part 15 is a flat face. As shown in FIG. 4, the under faces of the TAB tape 17, TAB-tape supporting leads 16, and leads 18 are exposed from the under face of the sealing part 15, and the outer end faces of the lead 18 and the TAB-tape supporting leads 16 are flush with the peripheral face of the sealing part 15 and exposed in the peripheral face of the sealing part 15. That is, the power amplifier device 10 of the first embodiment is a so-called non-lead type semiconductor device such that leads do not project from the peripheral face of the sealing part 15. Since the sealing part 15 has a square shape, the power amplifier device 10 has a QFN structure.

In manufacture of the power amplifier device 10, a lead frame made of a metal is used. The lead frame is obtained by forming a thin flat metal plate in a desired pattern by etching or press. A single lead pattern includes a square-shaped frame. In the frame, the TAB tape, the TAB tape supporting leads, and the leads are provided. The lead and the TAB tape supporting lead extend so as to project from the inner circumferential face of the frame to the inside. In the lead frame, a lead pattern is arranged in one line or a few lines, and product forming parts by the lead pattern are disposed in one line or a matrix.

In manufacture of the power amplifier device, the semiconductor chip 20 is fixed (mounted) on the top face of the TAB tape 17 of each of product forming parts via an unshown adhesive by performing chip bonding. After that, by performing wire bonding, the electrode pad 21 on the top face of the semiconductor chip 20 and an inner end part of the lead 18 are connected via the conductive wire 22. Subsequently, by performing transfer molding, an insulating resin layer having a predetermined height is formed on the top face side of the lead frame. By performing dicing to separate the lead frame and the insulating resin layer from each other, the power amplifier device 10 shown in FIGS. 2 to 4 is manufactured.

In the transfer molding, a lead frame is sandwiched between a lower-half die and an upper-half die of a transfer molding apparatus, and a resin is charged into a cavity formed by the upper-half and lower-half dies, thereby forming an insulting resin layer. Since the under face of the lead frame is placed on a flat surface (parting surface) of the lower-half die, the charged resin does not enter the under surface of the lead frame. As a result, the under face of each of the TAB tape supporting lead 16, TAB tape 17, and lead 18 is exposed in the under face of the insulating resin layer. Since the ceiling face of the cavity is formed flatly and is parallel to the parting surface of the lower-half die, the height of the insulating resin layer, that is, the sealing part 15 is constant as shown in FIG. 4. Since the lead frame and the insulating resin layer are diced by a dicing blade at the same time, an external end face of each of the lead 18 and the TAB supporting lead 16 is flush with the circumferential face of the sealing part 15 and is exposed to the circumferential face of the sealing part 15.

Figure 5:
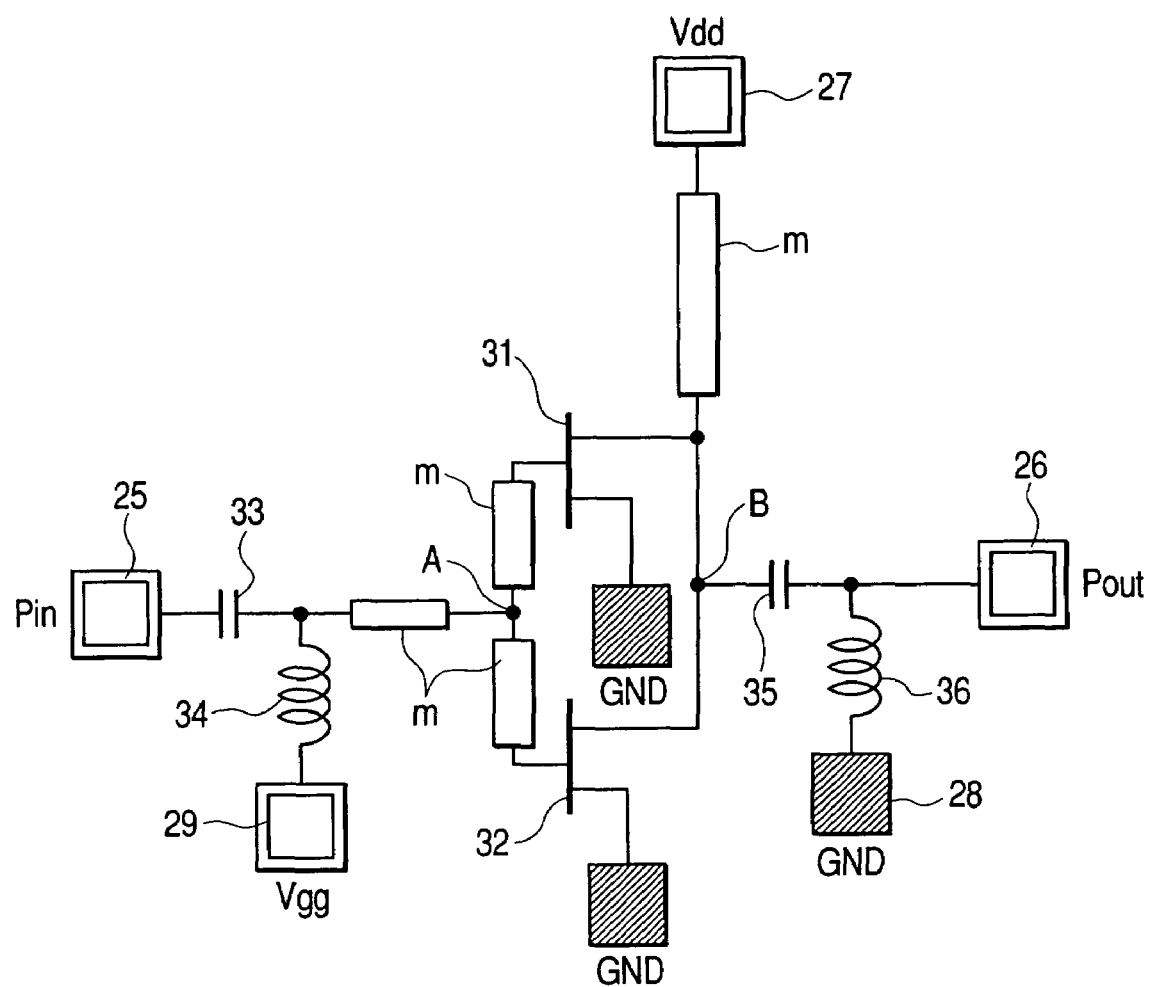
FIG. 5 is an equivalent circuit of the MMIC chip.

FIG. 1 is a schematic plan view of the semiconductor chip 20, that is, an MMIC chip. FIG. 5 is an equivalent circuit of the semiconductor chip 20. The semiconductor chip 20 has, as shown in FIG. 1, a plurality of electrode pads 21 on the top face. The electrode pads 21 are, as shown in FIG. 5, an input electrode pad (Pin) 25, an output electrode pad (Pout) 26, an electrode pad (Vdd) 27 for first power source voltage, an electrode pad (GND) 28 for second power source voltage, and an electrode pad (Vgg) 29 for third power source voltage. As will be described later, a plurality of electrode pads 21 are formed in each of source electrode parts as second electrodes of transistors.

The power amplifier device 10 of the first embodiment has a configuration in which, as shown in the equivalent circuit diagram of FIG. 5, two transistors 31 and 32 are connected in parallel between the input electrode pad (Pin) 25 and the output electrode pad (Pout) 26. The transistors 31 and 32 are HEMTs. A control electrode (gate electrode) as an input electrode of the transistors and a first electrode (drain electrode) as an output electrode are connected to each other, and the connection portions serve as connection nodes A and B. Between the connection node A on the gate electrode side and the input electrode pad 25, an MIM capacitor 33 is connected. Between the connection node A and the electrode pad (Vgg) 29 for third power source voltage, an inductance 34 is connected.

Between the connection node B on the drain electrode side and the output electrode pad (Pout) 26, an MIM capacitor 35 is connected. An inductance 36 is connected between the MIM capacitor 35 and the electrode pad (GND) 28 for second power source voltage. The drain electrodes of the transistors 31 and 32 are connected to the electrode pad (Vdd) 27 for first power source voltage, and a potential Vdd is applied to the drain electrode. For example, Vdd is 3.3V. The second electrode (source electrode) of the transistors 31 and 32 is connected to the electrode pad (GND) 28 for second power source voltage.

At the electrodes of the transistors 31 and 32, the gate electrode and the drain electrode are connected to the electrode pads 21 via wires (to which numerals are not given) provided for the semiconductor chip 20. In contrast, as shown in FIGS. 2 and 1, the source electrode has a structure in which a part of the source electrode pattern has the plurality of electrode pads 21.

In a transistor, an input matching circuit, an output matching circuit, or a bias circuit is constructed by a capacitor, a resistor, an inductance, and the like. A microstrip line "m" shown by a rectangular portion in FIG. 5 is also a part of the circuits. The potential (Vgg) supplied as a bias potential from the electrode pad (Vgg) 29 for third power source voltage is, for example, −1.0V.

Next, the semiconductor chip 20 having the MMIC structure will be described. FIG. 1 shows the semiconductor chip 20 having a one-stage amplifier configuration. The invention is not limited to the configuration. In the case of obtaining a higher amplification factor, a multi-stage amplifier configuration in which transistors are cascaded in a number of stages is employed. Although the number of amplification system is one, a plurality of amplification systems which can be used while being switched by a change-over switch may be provided.

In the amplification system in the power amplifier device 10 of the first embodiment, as shown in FIG. 1, two transistors (HEMTs) are connected in parallel between the input electrode pad (Pin) 25 and the output electrode pad (Pout) 26, thereby increasing the output.

The transistor 31 has a drain electrode 37, a source electrode 38, and a gate electrode 39. Each of the electrodes is constructed by a base portion linearly extended and a plurality of fingers projected in the direction perpendicularly crossing the base portion (a plurality of fingers projected in a comb teeth shape from one end of the base portion). Specifically, the drain electrode 37 is constructed by a drain base portion 37a and a plurality of drain fingers 37b extended from one end of the drain base portion 37a. The source electrode 38 is constructed by a source base portion 38a and a plurality of source fingers 38b extended from one end of the source base portion 38a. The gate electrode 39 is constructed by a gate base portion 39a and a plurality of gate fingers 39b extended from one side of the gate base portion 39a.

Each of the fingers extends so as to cross a channel region 40. A pattern is formed in which one of the fingers of a first electrode (drain electrode) is disposed between two neighboring fingers of a second electrode (source electrode). In other words, the fingers of the electrodes are arranged so as to mesh with each other. That is, a mesh pattern such that the gate finger 39b is positioned between the drain finger 37b and the source finger 38b is formed. The source base portion 38a is provided with a plurality of (six) square-shaped electrode pads 21. To the electrode pads 21, the wires 22 are connected as shown in FIG. 2. The source electrode is connected to a fixed potential.

The transistor 32 has a drain electrode 42, a source electrode 43, and a gate electrode 44. Each of the electrodes of the transistor 32 is constructed by a base portion extended linearly and a plurality of fingers projected like a comb-teeth shape from one side of the base portion. Specifically, the drain electrode 42 is constructed by a drain base portion 42a and a plurality of drain fingers 42b extending from one side of the drain base portion 42a. The source electrode 43 is constructed by a source base portion 43a and a plurality of source fingers 43b extending from one side of the source base portion 43a. The gate electrode 44 is constructed by a gate base portion 44a and a plurality of gate fingers 44b extending from one side of the gate base portion 44a.

Each of the fingers extends so as to cross a channel region 45, and the fingers of the electrodes are arranged so as to mesh with each other. That is, a mesh pattern is obtained such that the gate finger 44b is positioned between the drain finger 42b and the source finger 43b. The source base portion 43a is provided with a plurality of (six) square-shaped electrode pads 21. To the electrode pads 21, the wires 22 are connected as shown in FIG. 2.

The gate electrodes 39 and 44 of the transistors 31 and 32 are connected to each other and construct the connection node A as described above. The drain electrodes 37 and 42 of the transistors 31 and 32 are connected to each other and construct the connection node B as described above.

As described above, the MIM capacitor 33 is connected between the connection node A on the side of the gate electrodes and the input electrode pad 25, and the inductance 34 is connected between the connection node A and the electrode pad 29 for third power source voltage. The MIM capacitor 35 is connected between the connection node B on the drain electrode side and the output electrode pad 26, and the inductance 36 is connected between the MIM capacitor 35 and the electrode pad 28 for second power source voltage. To the drain electrodes of the transistors 31 and 32, the electrode pad (Vdd) 27 for first power source voltage is connected, and the potential Vdd is applied to the drain electrodes. Lines connected to the electrode pads 21 and electrodes in FIG. 1 are wires and the microstrip lines m. In FIG. 2, to avoid complication of the drawing, reference numerals of the transistors 31 and 32, the electrode pads 21, and the wires 22 connected to the electrode pads 21 are shown but the other reference numerals are omitted.

In the power amplifier device 10, as shown in FIG. 2, the electrode pads 21 on the top face of the semiconductor chip 20 are connected to the leads 18 disposed around the TAB tape 17 and to the TAB tape 17 via the wires 22. In FIG. 2, reference numerals 1 to 12 are given to the leads 18. The lead 18 having reference numeral 2 serves as an input terminal (Pin) and is electrically connected to the input electrode pad 25 of the semiconductor chip 20 via the wire 22. The lead 18 having reference numeral 8 serves as an output terminal (Pout) and is electrically connected to the output electrode pad 26 of the semiconductor chip 20 via the wire 22.

The lead 18 having reference numeral 9 serves as a first power source voltage terminal (Vdd) and is electrically connected to the electrode pad 27 for first power source voltage of the semiconductor chip 20 via the wire 22. The lead 18 having reference numeral 4 serves as a third power source voltage terminal (Vgg) and is electrically connected to the electrode pad 29 for third power source voltage of the semiconductor chip 20 via the wire 22. The electrode pad (GND) 28 for second power source voltage of the semiconductor chip 20 is electrically connected to the TAB tape 17 of the ground potential via the wire 22.

The plurality of electrode pads 21 and the TAB tape 17 provided for the source electrode parts of the transistors 31 and 32 are electrically connected to each other via the conductive wires 22. The leads 18 having reference numerals 1, 3, 5, 6, 7, 10, 11, and 12 are non-contact leads which are not used in the circuit. However, the non-contact (NC) leads are used as terminals for mounting at the time of mounting the power amplifier device 10 onto a mounting board.

In the structure, to make the inductance of the source electrode close to the inductance in the case of the via hole, the number of wires connected (metal lines each having a diameter of 25 μm) is set to the maximum number of six.

Figure 6:
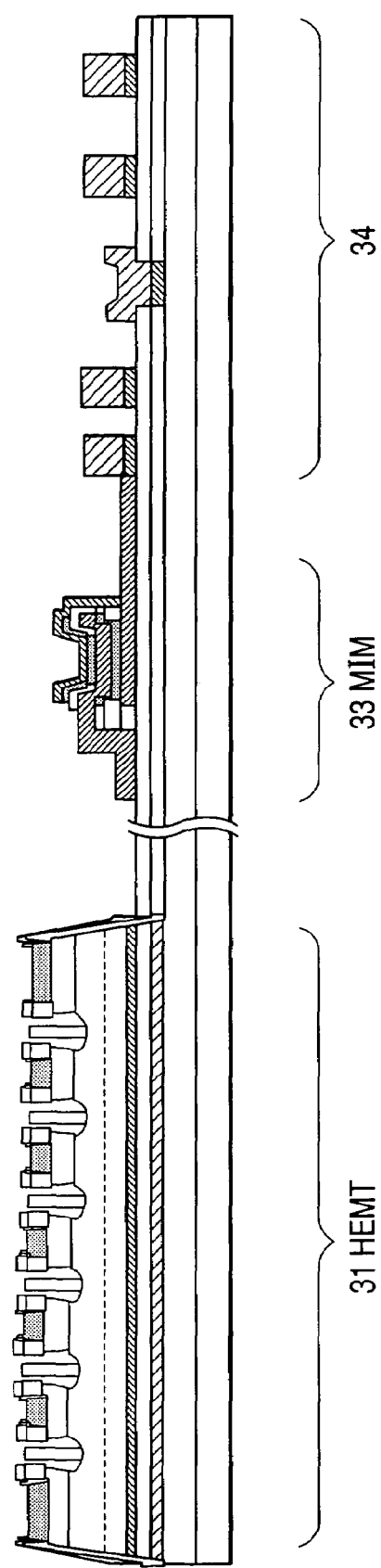
FIG. 6 is a schematic cross section showing an HEMT part, an MIM capacitor part, and a spiral inductance part of the MMIC chip.
Figure 7:
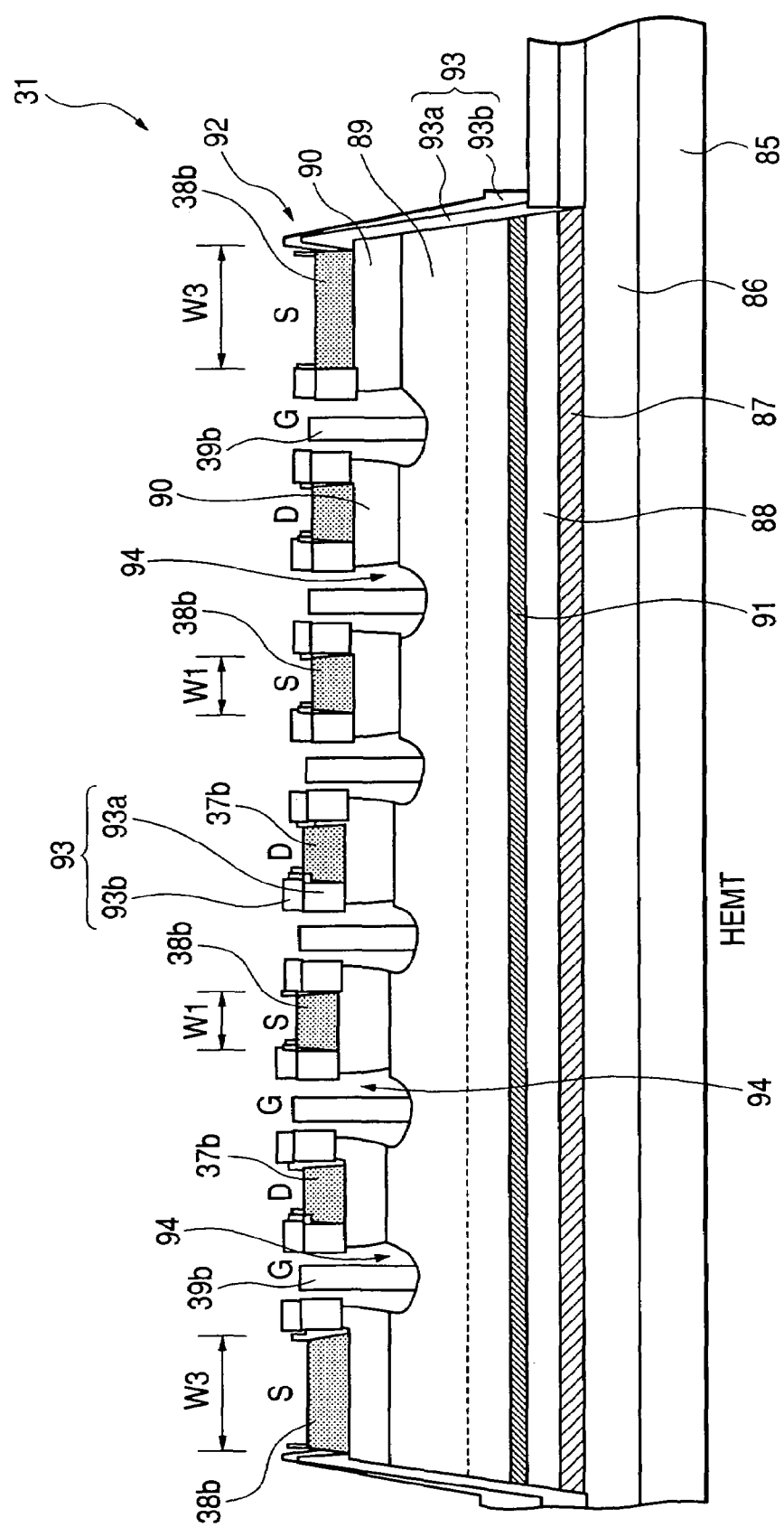
FIG. 7 is a schematic enlarged cross section showing the HEMT part.
Figure 8:
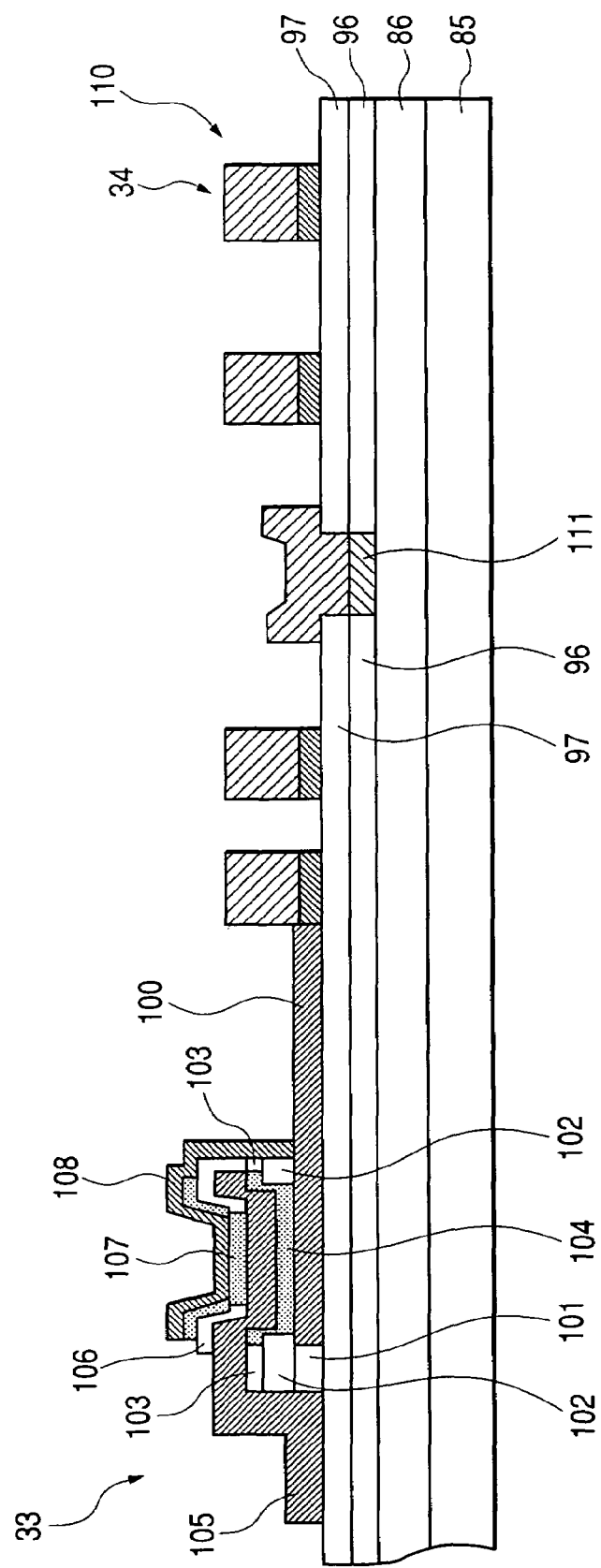
FIG. 8 is a schematic enlarged cross section showing the MIM capacitor part and the spiral inductance part.
Figure 9:
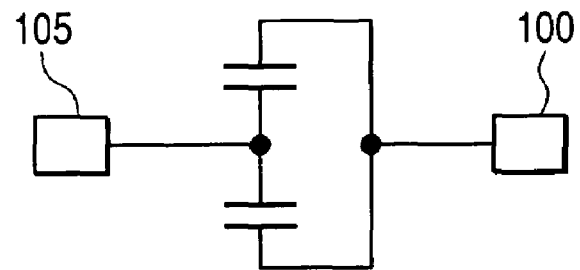
FIG. 9 is an equivalent circuit diagram of the MIM capacitor.

The transistor (HEMT), MIM capacitor, and inductance in the semiconductor chip 20 will be described with reference to FIGS. 6 to 9. FIG. 6 is a schematic cross section showing an HEMT part, an MIM capacitor part, and a spiral inductance part of the MMIC chip. FIG. 7 is a schematic enlarged cross section showing the HEMT part. FIG. 8 is a schematic enlarged cross section showing the MIM capacitor part and the spiral inductance part. FIG. 9 is an equivalent circuit diagram of the MIM capacitor.

FIG. 6 is a diagram in which the HEMT, MIM capacitor, and inductance are disposed in order from left to right for convenience of description. It is assumed here that the transistor 31 is shown as the HEMT, the MIM capacitor 33 is shown as the MIM capacitor, and the inductance 34 is indicated as the inductance. Since these components will be described with reference to FIG. 7 or subsequent diagrams, the other reference numerals to FIG. 6 are omitted.

The semiconductor chip 20 is formed on a semi-insulating GaAs substrate 85 as a base as shown in FIG. 7. On the top face (main face) side of the semi-insulating GaAs substrate 85, a GaAs epitaxial layer 86 is formed. The transistor 31 portion has a structure in which a high-resistance buffer layer 87 made of AlGaAs, an undoped AlGaAs layer 88, an $n^+$-AlGaAs layer 89 of two layers as an electron supply layer, and an $n^+$-GaAs layer 90 for obtaining ohmic contact are sequentially formed on the GaAs epitaxial layer 86. Near the junction between the AlGaAs layer 88 and the two $n^+$-AlGaAs layers 89, a two-dimensional electron channel 91 is formed. The buffer layer 87 plays the role of preventing leak current and preventing a short channel effect in an HEMT.

The HEMT formation region is etched to thereby form a mesa portion 92. The mesa etching reaches the surface layer of the GaAs epitaxial layer 86 through the buffer layer 87. The surface of the mesa portion 92 is covered with an insulating film 93 (an $SiO_2$ film 93a and an SiN film 93b) and the insulating film 93 is selectively etched. By performing etching with the residual insulating film 93 as a mask, a trench 94 extending through the $n^+$-GaAs layer 90 and reaching the surface layer of the two $n^+$-AlGaAs layers 89 is formed in a predetermined pattern. In the first embodiment, the gate fingers 39b of the gate (G) electrode 39 are provided on the trenches 94. In correspondence with FIG. 1, six trenches 94 are provided in parallel with each other.

For example, the $n^+$-GaAs layers 90 on both sides of the trench 94 are used as drain and source regions. Therefore, the insulating film 93 covering the top face of the $n^+$-GaAs layer 90 is selectively removed and contact holes are formed. In the contact holes, the drain fingers 37b of the drain (D) electrode 37 or the source fingers 38b of the source (S) electrode 38 are formed. The gate electrode 39 is made of Pt and the drain and source electrodes 37 and 38 are made of AuGeNi. The thickness of each of the drain and source electrodes 37 and 38 is about 0.38 μm.

The MIM capacitor 33 and the inductance 34 have a section structure shown in FIG. 8. Specifically, in a region in which the MIM capacitor 33 and the inductance 34 are formed, the buffer layer 87 and layers upper than that are etched. On the GaAs epitaxial layer 86, insulating films 96 and 97 are stacked.

Reference numeral 100 in the MIM capacitor 33 portion in FIG. 8 denotes a lower electrode formed on the insulating film 97. The lower electrode 100 extends to connect the MIM capacitor 33 and the inductance 34 and serves as a line reaching the connection node A. A left end portion of the lower electrode 100 is covered with insulating films 101, 102, and 103 selectively overlapped, and the top face of a part of the lower electrode 100 is exposed. A dielectric layer 104 forming a capacitance is selectively formed so as to be overlapped with the exposed portion. The periphery of the dielectric layer 104 extends even to the top face of the insulating film 102. A lead electrode 105 overlapped on the top face of the dielectric layer 104, the top face and left end faces of the insulting films 101 to 103 and, further, the top face of the insulating film 97 is formed. In such a manner, one of the MIM capacitors is formed. The lead electrode 105 is connected to the electrode pad (Vgg) 29 for third power source voltage.

In a portion corresponding to the dielectric layer 104 of the top face of the lead electrode 105, an insulating film 106 is selectively formed, thereby forming a structure that the top face of the lead electrode 105 is exposed. A dielectric layer 107 as a component of the capacitor is selectively formed so as to overlap the exposed lead electrode 105. The dielectric layer 107 extends also on the insulating film 106 in the periphery. An upper electrode 108 is also formed so as to overlap on the top face of the dielectric layer 107, the top face and the right end face of the insulating film 106, and right end faces of the insulting films 103 and 102. The upper electrode 108 is electrically connected to the lower electrode 100. By the above, another MIM capacitor is formed. With the configuration, the MIM capacitor shown in the equivalent circuit diagram of FIG. 9 is formed. The dielectric layers 104 and 107 are formed by an SiO$_2$ film.

The inductance 34 is formed by a square-cornered spiral part 110 as shown in FIGS. 8 and 1 (in FIG. 1, the reference numeral is not shown). The center of the spiral part 110 is electrically connected to a lead electrode 111 formed on the top face of the GaAs epitaxial layer 86. The lead electrode 111 passes under the insulating film 97 and is linked with the electrode pad (Vgg) 29 for third power source voltage. The outer end of the spiral part 110 is electrically connected to the lower electrode 100. A lower layer of the spiral part 110 is made of Mo and an upper layer of the spiral part 110 is made of Au. The lead electrode 111 is made of Al.

Figure 10:
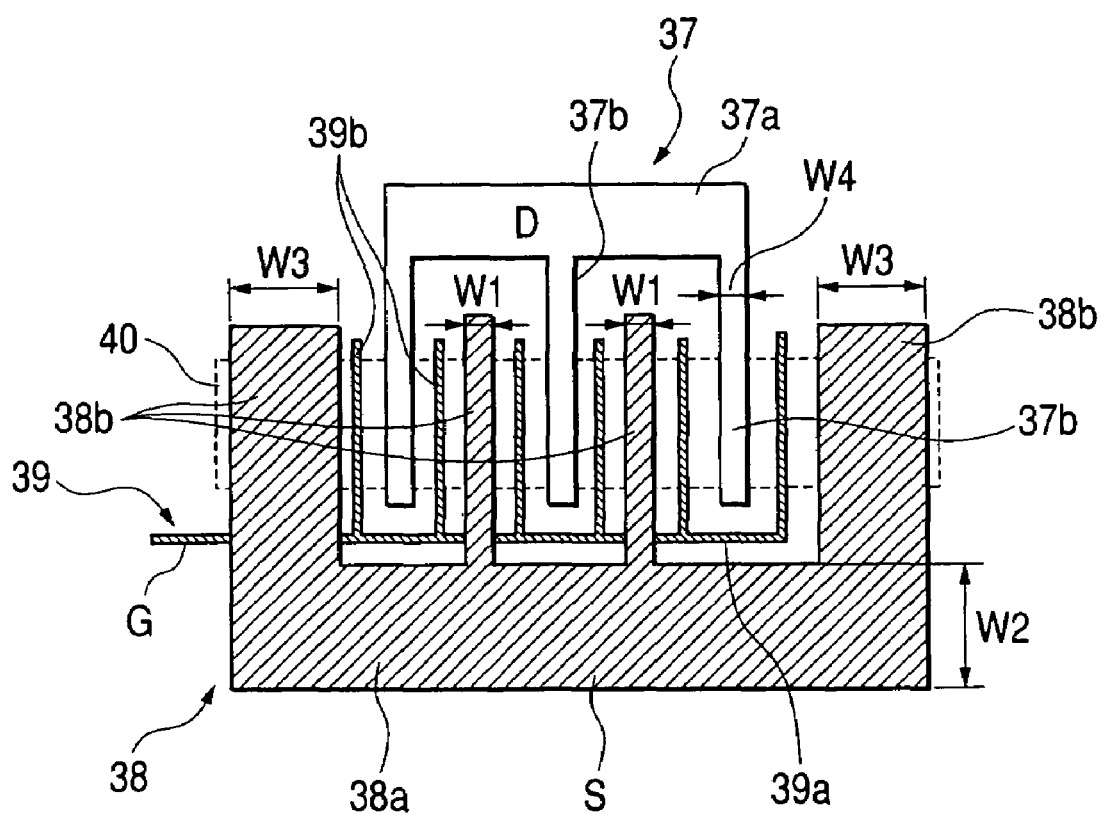
FIG. 10 is a schematic plan view showing an electrode pattern of the HEMT.

In the power amplifier device 10 of the first embodiment, the widths of the source fingers 38b of the source electrode 38 in the HEMT are set as shown in FIG. 10. Specifically, the width of each of fingers positioned at both ends is set to be different from the width of each of fingers positioned between the fingers positioned at both ends, and the width W3 of each of the source fingers 38b at both ends is set to be wider (thicker) than the width W1 of each of the source fingers 38b positioned between both ends. The width W3 is equal to or wider than the sum of the widths W1 of the source fingers 38b positioned between both ends. The width W2 of the source base portion 38a of the source electrode 38 is equal to or wider than the width W3.

The electrode patterns of the transistors 31 and 32 are symmetric with respect to a line connecting the input electrode pad 25 with the output electrode pad 26 as shown in FIG. 2. In each of the transistors 31 and 32, each of the fingers extends in the direction orthogonal to the line connecting the input electrode pad 25 and the output electrode pad 26. With the arrangement, the top face of the semiconductor chip 20 can be effectively used and miniaturization of the semiconductor chip 20 can be achieved. Although not shown in FIG. 10, the electrode pad 21 is provided for the source base portion 38a. In the first embodiment, six electrode pads 21 are provided in a line (refer to FIG. 1).

Figure 17:
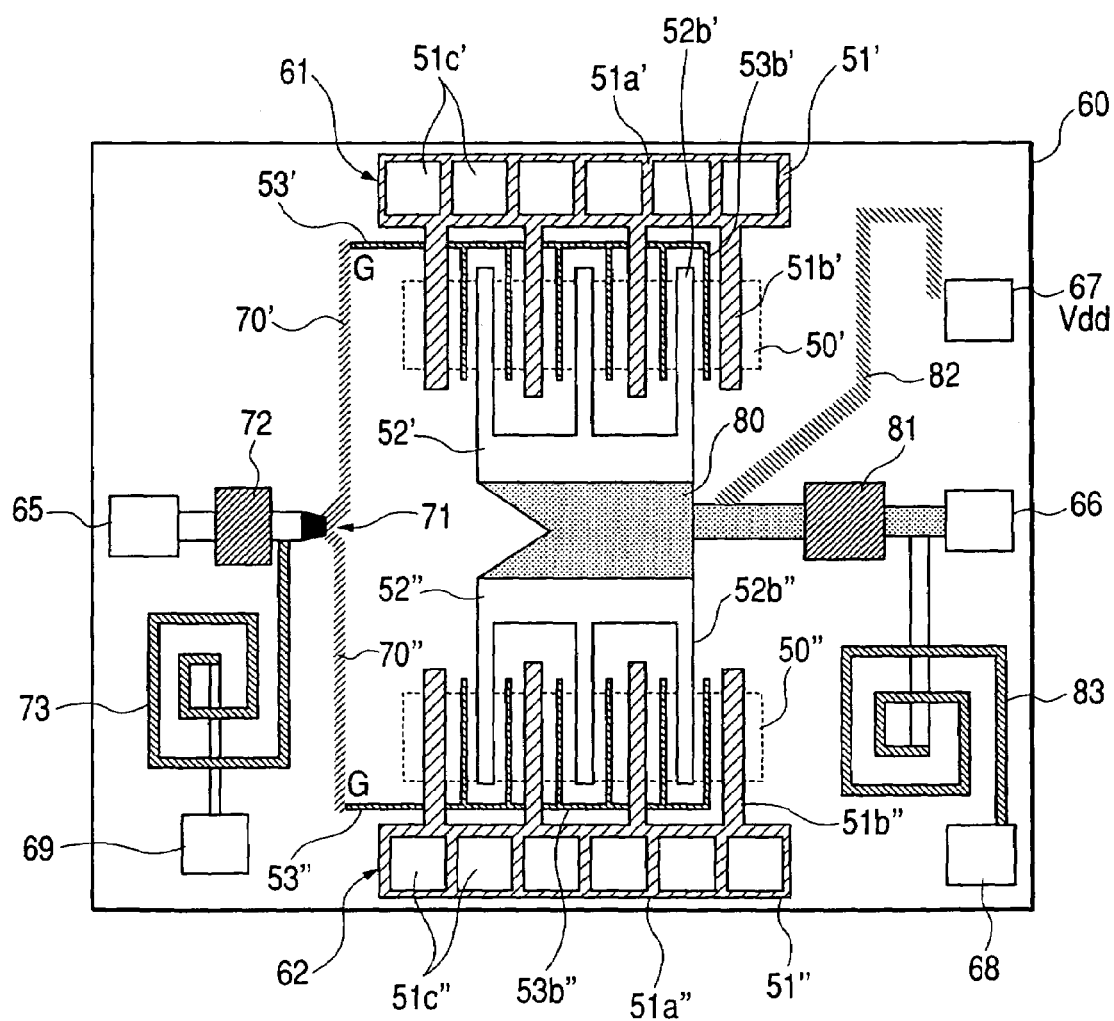
FIG. 17 is a schematic plan view showing an electrode pattern of an HEMT in an MMIC chip assembled in a conventional power amplifier device.

To verify the effects in the electrode pattern shown in FIG. 10, an MMIC was experimentally manufactured and verified. In an MMIC having the FET electrode pattern shown in FIG. 17 and an MMIC having the FET electrode pattern shown in FIG. 1, the number of source bonding wires of an EFT (HEMT) was set (six wires each of which is a metal line having a diameter of 25 μm) so as to achieve the same inductance as that in the case of forming via holes, and characteristics were compared. The gate width of the HEMT was set to 1.2 mm (the number of gate fingers was six), the gate length was set to 0.4 μm, the gate finger width was set to 200 μm, the width W1 of the source finger 38b on the inner side (between terminals) was set to 20 μm, the width W3 of the source finger 38b at an end was set to 60 μm, and the width W4 of the drain finger 37b was set to 20 μm.

Evaluation conditions are Vdd=5V, and Id=120 mA at 5.2 GHz. The result is as shown in Table 1.

| Items of characteristics | The present Invention | Conventional Configuration |
| --- | --- | --- |
| gain (dB) | 8.7 | 7.6 |
| P1dB (dBm) | 26.0 | 25.0 |
| width w1/w3 (μm) | 20/60 | 20/— |

Vd = 5 V, Id = 120 at 5.25 GHz

In the power amplifier device 10 of the first embodiment, the gain is improved by 1.1 dB from 7.6 dB of the conventional configuration to 8.7 dB of the first embodiment. At P1 dB (output power when the gain drops from a small signal gain by 1 dB), improvement in performance of 1 dBm can be recognized. Therefore, the number of wires can be reduced by an amount corresponding to the improvement in performance, and miniaturization of the semiconductor chip (chip shrink) can be realized.

The improvement in performance of the power amplifier device 10, that is, an HEMT device will be, though qualitatively, described with reference to FIG. 11. A drain current Id indicates the sum of currents Idi (i=1, 2, 3, 4, 5, 6) of unit gates. Although the currents Idi of unit gates are ideally the same, generally, the current value in the case where gates are arranged cyclically is large in a center portion where the electric field is concentrated and decreases toward the ends. Because of symmetry, Id3=Id4, Id2=Id5, and Id1 32 Id6.

Therefore, the following equation is obtained.

Id3=Id4>Id2=Id5>Id1=Id6                    Equation 1

As understood from Equation 1, by making the electrode on the outer side thicker (wider), electric field concentration in the center portion is lessened, and the currents Id1 and Id6 in the peripheral portion can be increased to almost the same as the currents Id3 and Id4 in the center portion. It can also be considered that the performance of the device is improved by increase in current.

In manufacture of the semiconductor chip 20 (MMIC chip) of the first embodiment shown in FIG. 1, as compared with manufacture using via holes, about five masks can be reduced. Moreover, there is no high-precision back face processing, so that the process can be shortened by about three weeks and reduction in manufacturing cost can be achieved. The thickness of a substrate (semi-insulating GaAs substrate) used for manufacture is as thick as about 150 μm, so that it is unnecessary to reduce the thickness. Consequently, there is no problem such as deterioration in handling, and workability improves.

The first embodiment has the following effects.

(1) In the first embodiment, in the source fingers 38b and 43b arranged in a comb-teeth shape, of the source electrodes 38 and 43 as earth electrodes of an HEMT, the electrode width W3 of each of the source fingers 38b and 43b positioned at both ends is set to be wider (thicker) than the electrode width W1 of each of the source fingers 38b and 43b positioned between both ends. Consequently, electric field concentration on each of the source fingers 38b and 43b in the center portion is lessened, current in the source fingers 38b and 43b positioned at both ends can be increased, and the performance (high frequency characteristic) of the device improves. The electrode width W3 of each of the source fingers 48b and 43b positioned at both ends is set to be equal to or wider than the sum of the widths W1 of the source fingers 38b and 43b positioned between both ends. Thus, concentration of the electric field in the source fingers 38b and 43b in the center portion is lessened, and increase in current in the source fingers 38b and 43b positioned at both ends can be achieved.

In the invention, also in an HEMT single body, that is, in a semiconductor device, the electrode width W3 of each of the source fingers positioned at both ends is set to be wider than the electrode width W1 of each of the source fingers positioned at both ends, so that concentration of the electric field in each of the source fingers in the center portion is lessened, current can be increased in the source fingers positioned at both ends, and the performance of the device (high frequency characteristic) is improved. The electrode width W3 of each of the source fingers positioned at both ends is set to be wider than the sum of the widths W1 of the source fingers positioned between both ends. Consequently, concentration of the electric field in the source fingers in the center portion is lessened, and increase in current in the source fingers positioned at both ends can be achieved.

(2) In the power amplifier device 10 of the first embodiment, power is output so as to reduce a current difference due to a potential difference in each of the positions of each of the plurality of drain fingers 37b and 42b of the output electrodes (drain electrodes 37 and 42) in the built-in transistors 31 and 32 (HEMTs) and so as to cause ohmic resistance of the earth electrodes (source electrodes 38 and 43), and the electrode width W2 of each of the common earth electrodes (source base portions 38a and 43a) for commonly connecting the plurality of earth electrode fingers (source fingers 38b and 43b) is set to be wider than the electrode width W3 of the source fingers 38b and 43b positioned at both ends. Thus, power loss can be reduced.

(3) The electrode patterns of the transistors 31 and 32 are symmetric with respect to the line connecting the input electrode pad 25 and the output electrode pad 26. In each of the transistors 31 and 32, each of the fingers extends in the direction orthogonal to the line connecting the input electrode pad 25 and the output electrode pad 26. With the arrangement, the top face of the semiconductor chip 20 can be effectively used and miniaturization of the semiconductor chip 20 can be achieved.

(4) In the power amplifier device 10 of the first embodiment, in manufacture of the semiconductor chip 20 (MMIC chip), as compared with manufacture using via holes, about five masks can be reduced. Since there is no high-precision back face processing, the process of about three weeks can be shortened and reduction in manufacturing cost can be achieved.

(5) In manufacture of the power amplifier device 10 of the first embodiment, the thickness of a substrate (semi-insulating GaAs substrate) used for manufacture is as thick as about 150 μm, so that it is unnecessary to reduce the thickness. Consequently, there is no problem such as deterioration in handling, and workability improves. It can reduce the manufacturing cost of the power amplifier device 10.

(6) From (1) to (5), according to the embodiment, the small and cheap power amplifier device having excellent high frequency characteristics and high performance (little power loss) can be provided.

(7) By assembling the high-performance small power amplifier device having excellent high frequency characteristics, a personal computer card having excellent characteristics can be provided. The size of the personal computer can also be reduced.

SECOND EMBODIMENT

Figure 14:
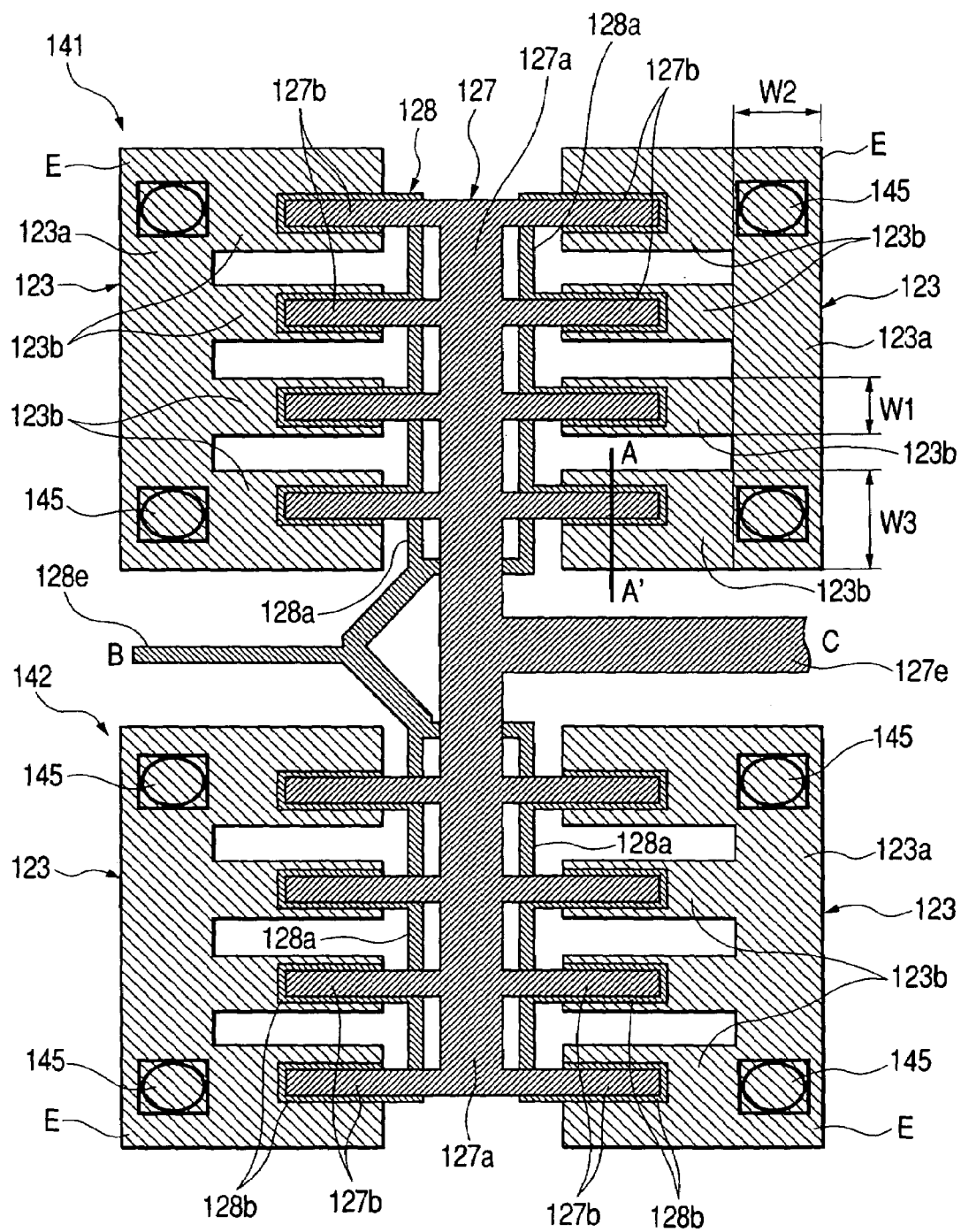
FIG. 14 is a schematic plan view showing an electrode pattern of an HBT in an MMIC chip assembled in a power amplifier device as another embodiment (second embodiment) of the invention.
Figure 15:
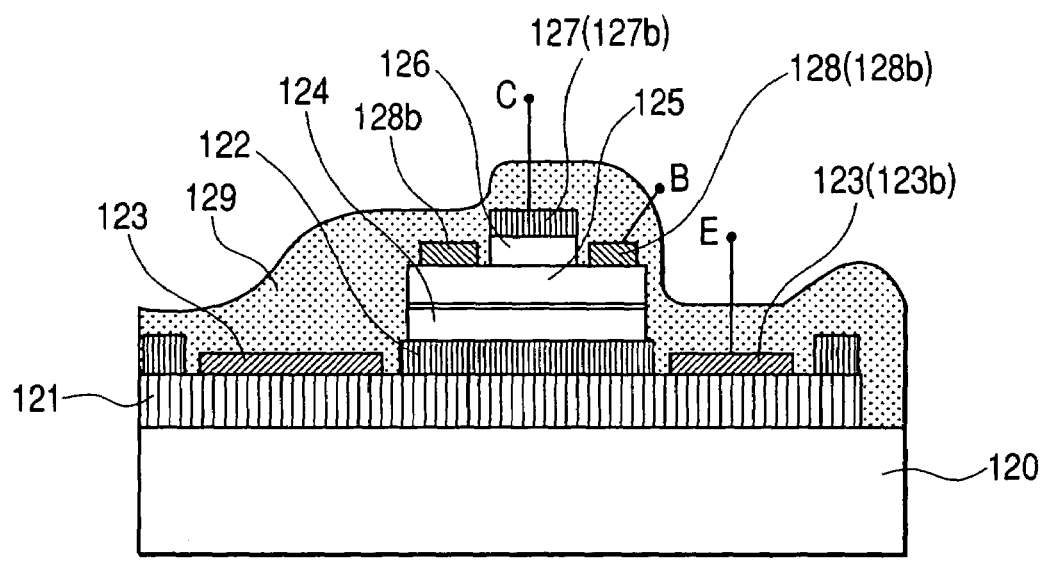
FIG. 15 is a schematic enlarged cross section taken along line A-A' of FIG. 14.
Figure 16:
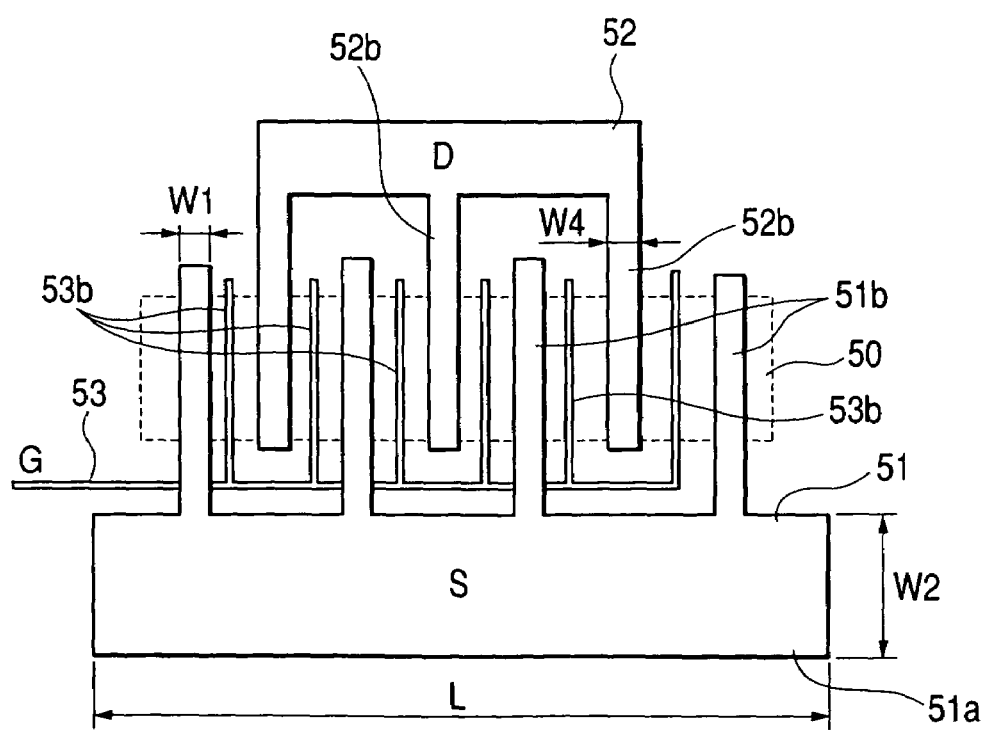
FIG. 16 is a schematic plan view showing an example of the electrode pattern of a conventional FET.

FIGS. 14 and 15 are diagrams of a power amplifier device as another embodiment (second embodiment) of the invention. Although an HEMT is assembled as a transistor in the semiconductor chip 20 (not shown) in the first embodiment, an HBT as a bipolar transistor is assembled in the semiconductor chip 20 in the second embodiment. FIG. 14 is a diagram showing a transistor part in the semiconductor chip 20.

In the second embodiment as well, to increase an output, a structure in which transistors (HBTs) 141 and 142 are connected in parallel in a manner similar to the first embodiment is employed. In FIG. 14, the transistor 141 is positioned in the upper stage and the transistor 142 is positioned in the lower stage. The transistors 141 and 142 are symmetrical with each other in the vertical direction. Therefore, corresponding components in the transistors 141 and 142 will be described by use of the same names and the same reference numerals.

Each of the transistors 141 and 142 has an emitter (E) electrode, a base (B) electrode, and a collector (C) electrode. In the second embodiment, a common emitter structure is employed. The electrode pattern of each of the HBTs 141 and 142 has, as shown in FIG. 14, like the electrode pattern of the HEMT of the first embodiment, a comb-shaped electrode structure. An emitter electrode 123, a base electrode 128, and a collector electrode 127 have a comb-teeth pattern constructed by base portions 123a, 128a, and 127a and a plurality of fingers 123b, 128b, and 127b extended from the base portions. In the case of the second embodiment, although not limited, an HBT structure is formed in such a manner that the plurality of collector fingers 127b are projected from both sides of the base portion 127a of the collector electrode 127 and the base fingers 128b and the emitter fingers 123b mesh with the collector fingers 127b.

The base fingers 128b extend so as to surround the collector fingers 127b with a small gap and so as not to be arranged in a ring shape. Each of the emitter fingers 123b projecting from the emitter base portion 123a is forked at some midpoint into two portions and the two portions extend so as to sandwich the base finger 128b with a small gap.

Each of the HBTs 141 and 142 has a pattern in which, to increase output, the plurality of collector fingers 127b are projected from both sides of the collector base portion 127a. Consequently, the emitter electrode 123 and the base electrode 128 are disposed on each of both sides of the collector base portion 127a extending in the vertical direction in FIG. 14.

The base portion 128a of the base electrode 128 is connected to a lead electrode 128e for the base. The number of lead electrodes 128e for the base finally becomes one and is led to the left side as shown in FIG. 14. The lead electrode 128e for the base is connected to the MIM capacitor 33 and the inductance 34 in the first embodiment. The collector base portions 127a of the HBTs 141 and 142 are connected to a lead electrode 127e for the collector. The lead electrode 127e for the collector is led to the right side as shown in FIG. 14. The lead electrode 127e for the collector is connected to the first power source voltage terminal (Vdd) 27 and the MIM capacitor 35 in the first embodiment.

A plurality of electrode pads 145 are provided for the emitter base portion 123a of the emitter electrode 123. To the electrode pad 145, the wire 22 connected to the TAB tape 17 is connected in a manner similar to the first embodiment.

The structure in a section taken along line A-A' of FIG. 14 as a finger portion will be described with reference to FIG. 15. An HBT has, as shown in FIG. 15, a structure in which an n-sub emitter layer 121 made of n$^+$-GaAs is selectively provided on the top face (main face) of a semi-insulating GaAs substrate 120. An n-GaAs emitter layer 122 is selectively formed on the top face of the n-subemitter layer 121. On the top face of the n-sub emitter layer 121 around the n-GaAs emitter layer 122, an emitter electrode 123 (emitter fingers 123b) made of AuGe is formed.

A p$^+$GaAs layer 124 is formed on the top face of the n-GaAs emitter layer 122, and an n-GaAs base layer 125 is provided on the p$^+$GaAs layer 124. An n-InGaP collector layer 126 is formed in the center portion of the top face of the n-GaAs base layer 125. On the top face of the n-InGaP collector layer 126, the collector electrode 127 (collector fingers 127b) made of WSi is provided. On the top face of the n-GaAs base layer 125 around the n-InGaP collector layer 126, the base electrode 128 (base fingers 128b) made of Pt is provided.

The main face side of the semi-insulating GaAs substrate 120 is covered with an insulating film 129. With the insulating film 129, the emitter electrode 123 (emitter fingers 123b), n-GaAs emitter layer 122, p$^+$GaAs layer 124, n-GaAs base layer 125, base fingers 128b, n-InGaP collector layer 126, and collector fingers 127b are covered.

Also in the earth electrode (emitter electrode 123) in each of the transistors (HBTs) 141 and 142 in the second embodiment, in a manner similar to the first embodiment, the width W3 of each of the fingers positioned at both ends of the emitter fingers 123b is wider than the width W1 of each of the fingers positioned between both ends and is equal to or larger than the sum of the widths W1 of the fingers positioned between both ends. With the configuration, in a manner similar to the first embodiment, concentration of the electric field in each of the emitter fingers 123b in the center portion is lessened, the current can be increased in the emitter fingers 123b positioned at both ends, and the performance (high frequency characteristics) of the device is improved. Since the width W2 of the emitter base portion 123a is equal to or wider than the width W3, power loss can be reduced.

Although the invention achieved by the inventor herein has been concretely described above on the basis of the embodiments, obviously, the invention is not limited to the foregoing embodiments but may be variously changed without departing from the gist. Specifically, although the examples of using an HEMT or an HBT as a transistor have been described in the embodiments, effects similar to those of the foregoing embodiments can also be obtained by a case using another transistor such as Si—GeFET or MOSFET.

Although one amplification system is provided in the power amplifier device of each of the embodiments, the invention can be likewise applied to a device having a plurality of amplification systems and effects similar to those of the embodiments can be obtained.

Effects obtained by a representative one of the inventions disclosed in the specification will be briefly described as follows.

(1) By reduction in inductance of the earth electrode, the high frequency characteristics of the power amplifier device can be improved.

(2) The manufacturing cost of the power amplifier device can be reduced.

(3) A personal computer card having excellent high frequency characteristics can be provided.

What is claimed is:

1. A power amplifier device having one or a plurality of amplification systems,
    wherein said amplification system has a semiconductor chip in which a transistor is formed and a plurality of external electrode terminals,
    wherein said external electrode terminals are an input terminal to which a signal to be amplified is supplied, an output terminal for outputting the amplified signal, and first, second, and third power source terminals,
    wherein said transistor is electrically connected between said input terminal and said output terminal,
    wherein electrodes of said transistor are a control electrode connected to said input terminal and said third power source terminal, a first electrode connected to said output terminal and said first power source terminal, and a second electrode connected to said second power source terminal serving as an earth terminal,
    wherein a first plurality of electrode pads, corresponding to said input, output, first power source and third power source terminals, are formed over a top face of said semiconductor chip,
    wherein said first plurality of electrode pads are electrically connected, via conductive wires, to said corresponding input, output, first power source and third power source terminals,
    wherein a second plurality of electrode pads are formed on a portion of said second electrode of said transistor, wherein said second plurality of electrode pads are electrically connected via conductive wires to said second power source terminal,
    wherein each of said electrodes of said transistor is constructed by a base portion and a plurality of fingers projected in a direction orthogonal to said base portion, one of the fingers of said first electrode is disposed between two neighboring fingers of said second electrode,
    wherein said second electrode is connected to a fixed potential, and
    wherein each of said fingers of said second electrode, which are positioned at opposite ends of the base portion of said second electrode, has a first width, and
    wherein each of said fingers of said second electrode, which are positioned between said fingers at the opposite ends, has a second width, and wherein the first width is wider than the second width.

2. The power amplifier device according to claim 1, wherein the first width is equal to or wider than a sum of the widths of said plurality of fingers positioned between said fingers at the opposite ends.

3. The power amplifier device according to claim 1, wherein a width of said base portion of said second electrode is wider than the first width.

4. The power amplifier device according to claim 1, wherein said first electrode is a drain electrode, said second electrode is a source electrode, and said control electrode is a gate electrode.

5. The power amplifier device according to claim 1, wherein said first electrode is a collector electrode, said second electrode is an emitter electrode, and said control electrode is a base electrode.

6. The power amplifier device according to claim 1, wherein two transistors are formed in said semiconductor chip and are electrically connected in parallel with each other between said input terminal and said output terminal.

7. The power amplifier device according to claim 1, further comprising:
   a supporting substrate mounting said semiconductor chip and constructing said second power source terminal;
   a plurality of leads disposed around said supporting substrate and constructing said external electrode terminals; and
   a sealing part made of an insulating resin for covering said supporting substrate, said external electrode terminals, said semiconductor chip, and said conductive wires in a state wherein an under face of said supporting substrate and an under face of an external end face of each of said external electrode terminals are exposed.

8. The power amplifier device according to claim 7, wherein said sealing part has a square shape in plan view, and the external end face of each of said external electrode terminals is flush with a peripheral face of said sealing part.

9. The power amplifier device according to claim 1, wherein a plurality of transistors are cascaded between said input terminal and said output terminal to thereby obtaining a multi-stage amplification configuration.

10. The power amplifier device according to claim 1, wherein said base portions of said electrodes of said transistor extend in a same direction, said fingers of said electrodes extend in a direction orthogonal to the extending direction of each of said base portions, and each of said fingers extends in a direction orthogonal to a line connecting said input terminal with said output terminal.

11. The power amplifier device according to claim 1, wherein said power amplifier device is for a wireless LAN of a 5-GHz band.

* * * * *